United States Patent
Kamei et al.

(10) Patent No.: US 9,485,862 B2
(45) Date of Patent: Nov. 1, 2016

(54) ELECTRONIC DEVICES WITH CARBON NANOTUBE PRINTED CIRCUITS

(71) Applicant: Apple Inc., Cupertino, CA (US)

(72) Inventors: Ibuki Kamei, San Jose, CA (US); Timothy J. Rasmussen, Sunnyvale, CA (US); Trent K. Do, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/472,223

(22) Filed: Aug. 28, 2014

(65) Prior Publication Data

US 2016/0066419 A1    Mar. 3, 2016

(51) Int. Cl.
| | | |
|---|---|---|
| H01L 23/34 | (2006.01) | |
| H05K 1/03 | (2006.01) | |
| H05K 1/11 | (2006.01) | |
| H01L 29/78 | (2006.01) | |
| H05K 3/40 | (2006.01) | |

(52) U.S. Cl.
CPC ............. *H05K 1/0393* (2013.01); *H05K 1/111* (2013.01); *H05K 1/118* (2013.01); *H05K 3/4007* (2013.01)

(58) Field of Classification Search
CPC ...................... Y10S 977/742; H01L 21/02602
USPC ................... 438/149; 977/762, 770; 257/347
See application file for complete search history.

(56) References Cited

U.S. PATENT DOCUMENTS

| | | | |
|---|---|---|---|
| 8,164,000 B2 | 4/2012 | Yeh et al. | |
| 2005/0209392 A1* | 9/2005 | Luo | B82Y 30/00 524/496 |
| 2006/0274049 A1* | 12/2006 | Spath | B82Y 10/00 345/173 |
| 2007/0154714 A1* | 7/2007 | Mirkin | B05D 1/185 428/408 |
| 2010/0051331 A1* | 3/2010 | Tsai | B82Y 10/00 174/256 |
| 2010/0311494 A1* | 12/2010 | Miller | A63F 1/18 463/22 |
| 2010/0317409 A1* | 12/2010 | Jiang | G06F 1/1626 455/566 |
| 2011/0012476 A1* | 1/2011 | Chen | H01L 41/193 310/300 |
| 2011/0032196 A1* | 2/2011 | Feng | G06F 3/045 345/173 |
| 2011/0236670 A1* | 9/2011 | Kunze | B29C 65/5014 428/313.3 |

(Continued)

FOREIGN PATENT DOCUMENTS

KR    2010123755 A    11/2010

*Primary Examiner* — Moazzam Hossain
(74) *Attorney, Agent, or Firm* — Treyz Law Group, P.C.; G. Victor Treyz; Joseph F. Guihan

(57) ABSTRACT

An electronic device has structures such as substrates and internal housing structures. The substrates may be rigid substrates such as rigid printed circuit boards and flexible substrates such as flexible printed circuits, flexible touch sensor substrates, and flexible display substrates. Carbon nanotubes may be patterned to form carbon nanotube signal paths on the substrates. The signal paths may resist cracking when bent. A flexible structure such as a flexible printed circuit may have carbon nanotube signal paths interposed between polymer layers. Openings in a polymer layer may expose metal solder pads on the carbon nanotube signal paths. A stiffener may be provided under the metal solder pads. Polymer materials in the flexible structure may be molded to form bends. Bends may be formed along edges of a touch sensor or display or may be formed in a flexible printed circuit.

12 Claims, 16 Drawing Sheets

(56) References Cited

U.S. PATENT DOCUMENTS

| | | |
|---|---|---|
| 2012/0127113 A1 | 5/2012 | Yau et al. |
| 2012/0161317 A1 | 6/2012 | Rathburn |
| 2012/0193568 A1* | 8/2012 | Liu ............ C08J 3/21 252/62.9 R |
| 2013/0032861 A1* | 2/2013 | Lee ............ G06F 3/047 257/254 |
| 2014/0055686 A1 | 2/2014 | Wu |
| 2014/0071065 A1* | 3/2014 | Kung ............ G06F 3/041 345/173 |
| 2015/0337449 A1* | 11/2015 | Chung ............ C25D 9/04 205/188 |

\* cited by examiner

ELECTRONIC DEVICES WITH CARBON NANOTUBE PRINTED CIRCUITS

BACKGROUND

This relates generally to electronic devices and, more particularly, to structures such as printed circuits for electronic devices.

Printed circuits are often used to route signals within electronic devices such as cellular telephones, computers, and other electronic equipment. Electrical components can be mounted to a printed circuit using solder. Because printed circuits are relatively thin, the use of printed circuits to route signals between components in an electronic device can help minimize the size and weight of the device.

In some situations, it can be difficult to satisfactorily mount printed circuits within an electronic device. Flexible printed circuits often have bends and can be subjected to numerous bending and unbending cycles during operation of a device. If care is not taken, a flexible printed circuit will be bent too much. This can lead to cracks in signal lines on the flexible printed circuit and poor reliability. Although cracks can be reduced and reliability enhanced by placing restrictions on the amount of bending that is imposed on a flexible printed circuit, this can create undesired bulk and undesired limitations on the movement of the flexible printed circuit.

It would therefore be desirable to be able to provide improved structures such as printed circuits for electronic devices.

SUMMARY

An electronic device has structures such as substrates and internal housing structures. The substrates may include rigid substrates such as rigid printed circuit boards and flexible substrates such as flexible printed circuits, flexible touch sensor substrates, and flexible display substrates. The internal housing structures may include a carbon nanotube midplate that extends between opposing housing walls to lend structural support to an electronic device.

Carbon nanotubes may be patterned to form carbon nanotube signal paths on the substrates. The signal paths may resist cracking when bent. A bent portion of a carbon nanotube signal path may be formed in a portion of a flexible substrate that traverses a hinge or other flexible portion of an electronic device.

A flexible structure such as a flexible printed circuit may have a carbon nanotube layer interposed between polymer layers. The carbon nanotube layer may be patterned to form carbon nanotube signal paths that are covered by a polymer layer. Openings in the polymer layer may be formed to expose metal solder pads on the carbon nanotube signal paths.

A stiffener may be attached to the flexible printed circuit with adhesive under the metal solder pads. Polymer materials in the flexible structure may be molded to form bends. Bends may be formed along edges of a touch sensor or display, may be formed in a flexible printed circuit, or may be formed within other carbon nanotube flexible substrate structures.

DETAILED DESCRIPTION

Electronic devices may be provided with carbon nanotube structures or other structures based on carbon (e.g., graphene structures, carbon-fiber structures having carbon fibers other than carbon nanotubes, etc.). Configurations in which the carbon-based structures are carbon nanotube structures are sometimes described herein as an example.

Carbon nanotube structures may include single-wall carbon nanotubes, multiple-wall carbon nanotubes, or mixtures of single-wall and multiple-wall carbon nanotubes. Carbon nanotubes can form conductive paths for printed circuits or other flexible substrates such as substrates associated with touch sensors and displays and can form structural components in an electronic device.

Conductive carbon nanotube paths can form signal paths that are flexible and resistant to cracking The carbon nanotube structures may be incorporated into signal cables such as flexible printed circuit cables, rigid printed circuit boards, printed circuits that include rigid portions with flexible tails (sometimes referred to as "rigid flex"), portions of display structures, portions of touch sensors such as capacitive touch sensor arrays for displays or track pads, camera structures, antenna structures, housing structures, internal device structures, electrical components, substrates, brackets, housing walls, other structures, or combinations of these structures.

Figure 1:
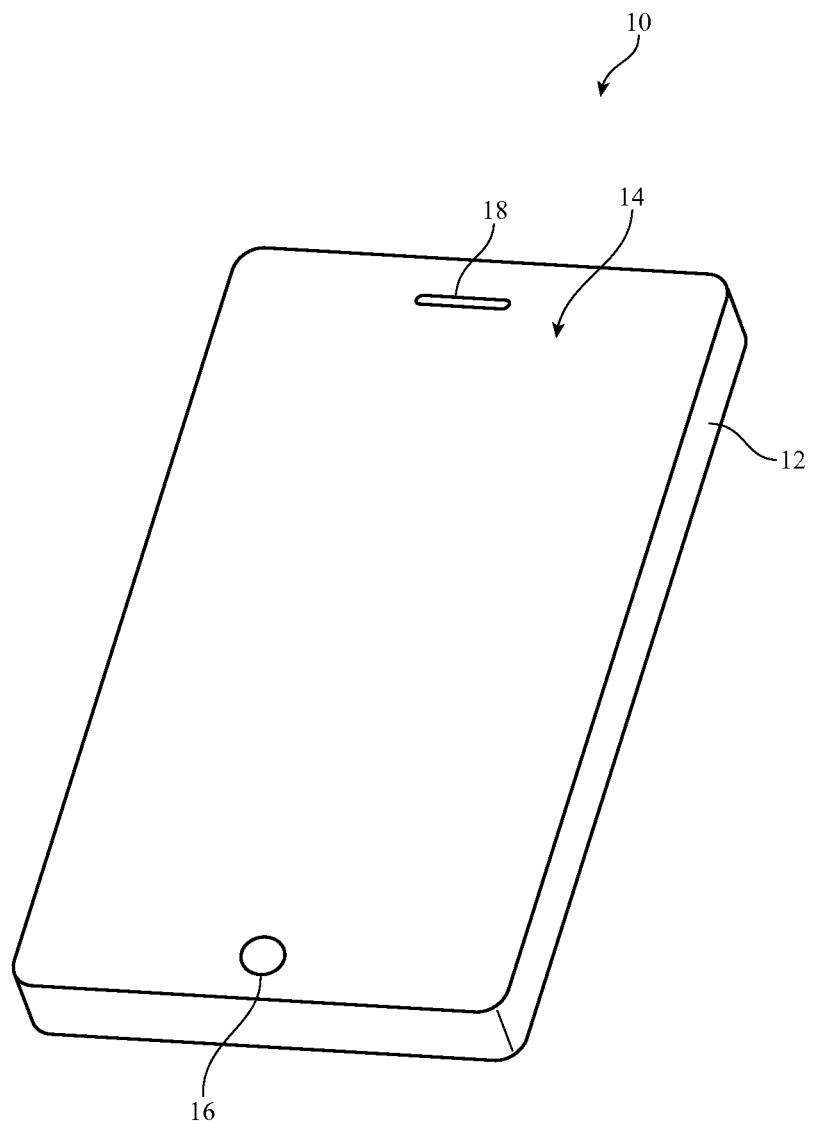
FIG. 1 is a perspective view of an illustrative electronic device in accordance with an embodiment.

FIG. 1 is a perspective view of an illustrative electronic device of the type that may include carbon nanotube structures. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes display 14. Display 14 has been mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma display pixels, an array of organic light-emitting diode pixels, an array of electrowetting pixels, or pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports, holes for buttons, and other structures.

Figure 2:
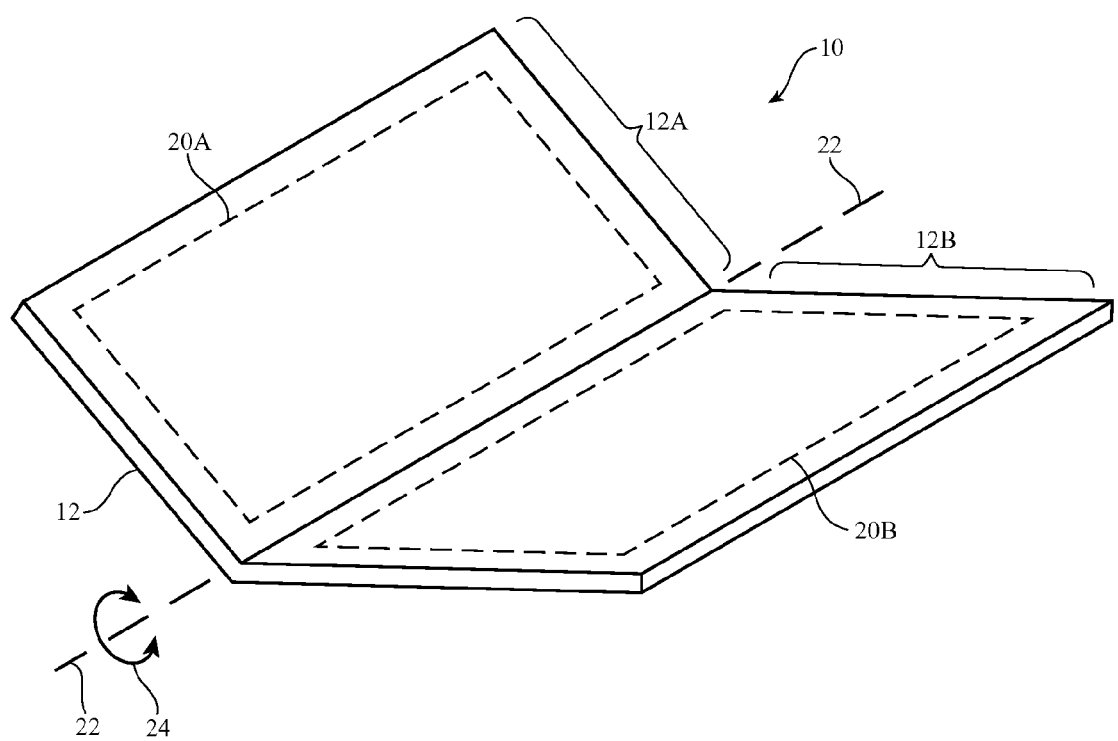
FIG. 2 is a perspective view of an illustrative electronic device that bends along a flexible portion such as a flexible seam associated with a hinge in accordance with an embodiment.

If desired, device 10 may have a hinge or other bendable joint. An illustrative device that bends along a flexible seam is shown in FIG. 2. As shown in FIG. 2, device 10 may have two or more portions such as portions 12A and 12B that rotate with respect to each other in directions 24 about axis 22. Device 10 may be a laptop computer, a case for a tablet computer, a portable device with a flexible display, or other flexible device. There is a single bend axis in the example of FIG. 2 that allows device 10 to bend along a single flexible joint. Configurations for device 10 with multiple flexible regions may also be used.

Device 10 may contain components 20A and 20B in portions 12A and 12B, respectively. Portions 12A and 12B may be housing portions, may be portions of a case (e.g., a plastic cover for a device that is separate from the case), or may be other suitable structures. Components 20A and 20B may be respective halves of a display that flexes along the bendable joint that is aligned with axis 22, may be a keyboard and display, respectively, may be a keyboard or other component in a case and a table computer or other component mounted in the case, or may be other components in device 10.

Devices such as device 10 of FIGS. 1 and 2 may use carbon nanotube structures to form signal paths. The signal paths may be formed within a printed circuit or other structure. For example, carbon nanotube traces may be formed within a flexible substrate such as a flexible printed circuit, a flexible display, or a flexible touch sensor layer. Due to the strength and flexibility of carbon nanotubes, a carbon nanotube flexible substrate may be bent abruptly to form a thin device (see, e.g., device 10 of FIG. 1) and may be bent repeatedly to accommodate repeated bending of device 10 (e.g., when the carbon nanotube flexible substrate traverses a flexible joint such as the flexible portion of device 10 along bend axis 22 of FIG. 2 or otherwise bridges device portions that bend with respect to each other). Carbon nanotube signal paths may be less prone to cracking than metal traces in flexible printed circuits and other flexible substrates and may therefore be used to help enhance reliability in devices with bent flexible substrates.

Figure 3:
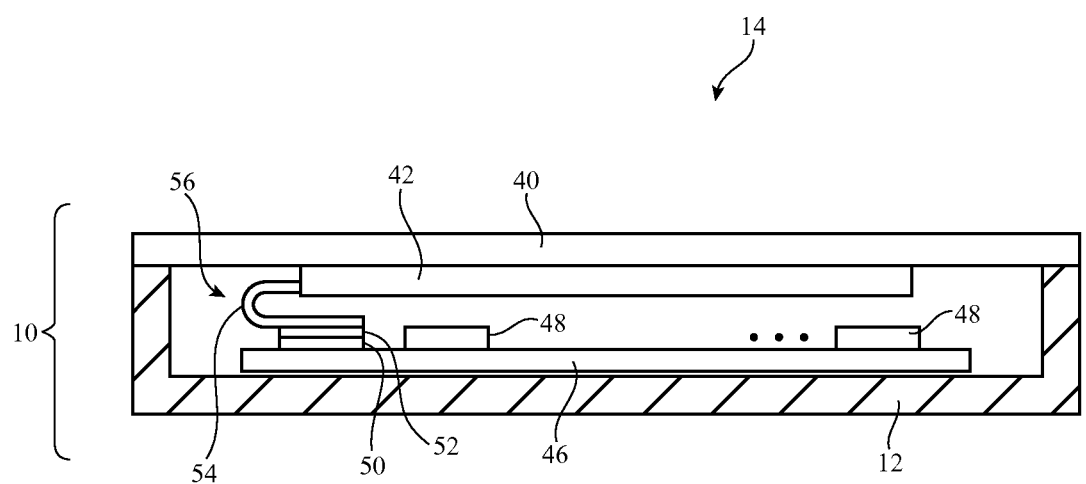
FIG. 3 is a cross-sectional side view of an illustrative electronic device having a flexible printed circuit with a bend in accordance with an embodiment.

A cross-sectional side view of an illustrative electronic device of the type that may include carbon nanotube structures is shown in FIG. 3. As shown in FIG. 3, display 14 of device 10 may be formed from a display module such as display module 42 mounted under a cover layer such as display cover layer 40 (as an example). Display 14 (display module 42) may be a liquid crystal display, an organic light-emitting diode display, a plasma display, an electrophoretic display, a display that is insensitive to touch, a touch sensitive display that incorporates and array of capacitive touch sensor electrodes or other touch sensor structures, or may be any other type of suitable display. Display cover layer 40 may be layer of clear glass, a transparent plastic member, a transparent crystalline member such as a sapphire layer, or other clear structure. Display layers such as the layers of display module 42 may be rigid and/or may be flexible (e.g., display 14 may be flexible).

Display 14 may be mounted to housing 12. Device 10 may have inner housing structures that provide additional structural support to device 10 and/or that serve as mounting platforms for printed circuits and other structures. Structural internal housing members may sometimes be referred to as housing structures and may be considered to form part of housing 12.

Electrical components 48 may be mounted within the interior of housing 12. Components 48 may be mounted to printed circuits such as printed circuit 46. Printed circuit 46 may be a rigid printed circuit board (e.g., a printed circuit board formed from fiberglass-filled epoxy or other rigid printed circuit board material) or may be a flexible printed circuit (e.g., printed circuit formed from a sheet of polyimide or other flexible polymer layer). Patterned conductive traces within printed circuit board 46 may be used to form signal paths between components 48. The conductive traces may be formed from conductive materials such as metal and/or carbon nanotubes.

If desired, components such as connectors may be mounted to printed circuit 46. As shown in FIG. 3, for example, a cable such as flexible printed circuit cable 54 may couple display module 42 to connector 52. Flexible printed circuit cable 54 (and other flexible substrates in device 10) may be formed from flexible polymer substrates such as polyimide layers and may have conductive traces formed from conductive material such as metal and/or carbon nanotubes. Connector 52 may mate with corresponding connector 50. Connectors 52 and 50 may be board-to-board connectors. Connector 52 may be soldered to flexible printed circuit 54 or may be attached to flexible printed circuit 54 using other techniques. Connector 50 may be soldered to printed circuit 46 or may be otherwise connected to printed circuit 46. When coupled as shown in FIG. 3, signals may pass from signal lines in flexible printed circuit 54 (e.g., display signals associated with operation of display 42) and signal lines in printed circuit 46.

To form a connection such as the signal path connection provided by flexible printed circuit 54, it may be desirable to bend flexible printed circuit 54 at one or more locations along the length of flexible printed circuit 54. In the example of FIG. 3, flexible printed circuit 54 has been bent once to form bend 56. Configurations in which flexible structures such as flexible printed circuit 54 are bent multiple times and/or in which a flexible substrate such as flexible printed circuit, flexible display, or flexible touch sensor are bent back and forth repeatedly during operation of a device with a hinge may also be used.

Figure 4:
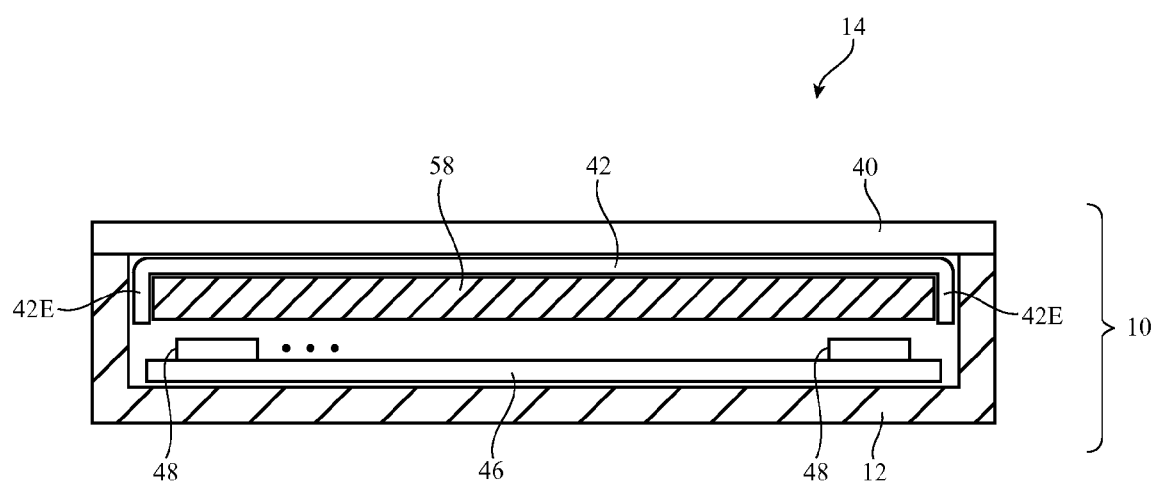
FIG. 4 is a cross-sectional side view of an illustrative electronic device having a display such as a touch sensor display with a bend in accordance with an embodiment.

FIG. 4 is a cross-sectional side view of device 10 in an illustrative configuration in which display module 42 is formed from one or more flexible display layers having bent edge portions 42E. Display module 42 may be, for example, a flexible organic light-emitting diode display formed from flexible polymer substrate layers such as one or more layers of polyimide or other flexible substrate materials. A flexible touch sensor may be incorporated into display 42, if desired.

Bent edge portions 42E may be located along the right and/or left sides of device 10 or elsewhere in device 10. In the example of FIG. 4, bent edge portions 42E have been formed by bending display module (display layer) 42 at right angles, so that both the left edge and the right edge form a right-angle bend with respect to the main active area of display module 42 under display cover layer 40. Displays with 180° bends and bends of other shapes may also be used. Display module 42 may be attached to the inner surfaces of device 10 such as display cover layer 40 and/or may be supported using structures such as structures 58. Structure 58 may be a support structure, internal device component(s) such as a battery or other circuitry, an internal housing structure, or other portions of device 10.

If desired, display modules such as illustrative display module 42 may include a touch sensor such as capacitive touch sensor or a touch sensor formed using other touch technologies. A capacitive touch sensor may have an array of capacitive touch sensor electrodes. When combined with a display, the capacitive touch sensor electrodes may be formed from transparent conductive material. For example, a touch sensor may be formed from an array of transparent indium tin oxide electrodes. Touch sensors such as these may be implemented using touch sensor substrates such as flexible polymer layers. The flexible touch substrate layers may be integrated into display module 42 or may be separate from display module 42 and may bend along edges such as edges 42E.

Structures in device 10 such as printed circuits (e.g., flexible printed circuit 54 of FIG. 3 and/or printed circuit 46 of FIG. 3), displays (e.g., flexible display layer(s) 42 of FIG. 4), touch sensors (e.g., a flexible touch sensor array in display layers 42 of FIG. 4 having active and/or inactive portions bent along edges 42E), and other structures in device 10 may be provided with carbon nanotubes. The carbon nanotubes may be patterned to form conductive signal paths that are resistant to damage when flexed.

Figure 5:
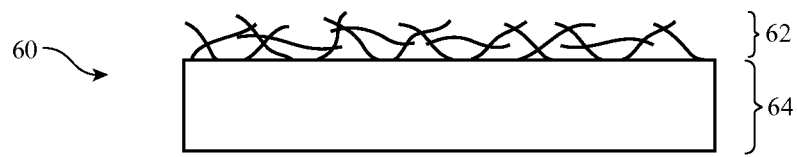
FIG. 5 is a cross-sectional side view of an illustrative carbon nanotube layer in which carbon nanotubes are being supported by a substrate in accordance with an embodiment.

An illustrative carbon nanotube structure is shown in FIG. 5. In the example of FIG. 5, carbon nanotubes 62 have been provided in a layer on top of substrate 64 to form carbon nanotube layer (sheet) 60. Carbon nanotubes 62 may be single wall nanotubes and/or multiple-wall nanotubes. Nanotubes 62 may be grown in a furnace using chemical vapor deposition techniques or may be grown using other suitable techniques. Nanotubes 62 may be grown directly on substrate 64 or may be grown on a separate substrate before being transferred to substrate 64 (e.g., in a liquid, in a powder, etc.). Substrate 64 may be a layer of metal foil, a polymer layer (e.g., a sheet of polyimide or other flexible polymer, a rigid polymer layer, etc.), a ceramic layer, a glass layer, a layer of polymer or other material to which carbon-fibers, glass fibers, or other fibers have been added, a rigid printed circuit board layer (e.g., a layer of fiberglass-filled epoxy), a layer of other materials, or a combination of two or more of these layers. Substrate 64 may have flexible portions and/or may have rigid portions.

Figure 6:
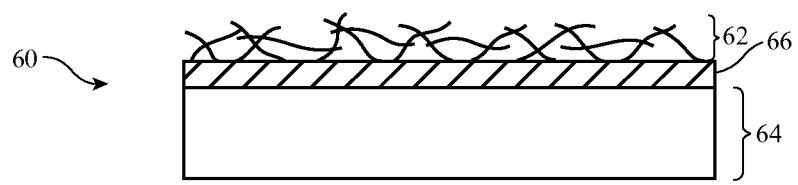
FIG. 6 is a cross-sectional side view of an illustrative carbon nanotube layer in which a layer of carbon nanotubes and a metal layer or other layer has been formed on a substrate in accordance with an embodiment.

As shown in FIG. 6, carbon nanotube layer 60 may have a layer of carbon nanotubes 62 formed on a substrate such as substrate 64 that has a coating layer such as coating 66. Substrate 62 may be a metal layer, a rigid or flexible polymer layer, a ceramic layer, a glass layer, a fiber-based composite layer, a layer of rigid printed circuit board material, other layers, or combinations of these layers. Layer 66 may be interposed between layer 64 and layer 62. Layer 66 may be a metal layer, a polymer layer, a ceramic layer, a glass layer, a fiber-based composite layer, a layer of rigid printed circuit board material, other layers, or combinations of these layers. As an example, layer 64 may be a flexible polymer substrate layer and layer 66 may be a metal layer (e.g., a metal coating) formed on the surface of polymer layer 64. Carbon nanotube layer 62 may be grown on the surface of coating layer 66 or carbon nanotubes for layer 62 may be grown elsewhere and transferred to layer 66.

Figure 7:
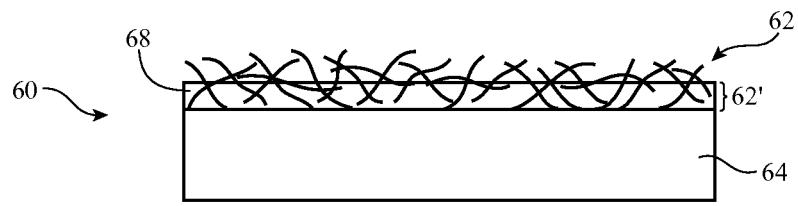
FIG. 7 is a cross-sectional side view of an illustrative carbon nanotube layer in which a layer of adhesive on a substrate has been used to attach a layer of carbon nanotubes to the substrate in accordance with an embodiment.

If desired, adhesive (e.g., polymer) may be used in attaching carbon nanotubes 62 to substrate 64. As shown in FIG. 7, for example, substrate 64 may be coated with a layer of adhesive such as polymer adhesive layer 68. Carbon nanotubes 62 (e.g., carbon nanotube powder) may be deposited on the surface of substrate 64 while adhesive 68 is in a tacky state (e.g., uncured liquid adhesive, tacky pressure sensitive adhesive, etc.). If desired, adhesive 68 may then be cured by application of ultraviolet light, by application of heat, by application of catalyst, etc. When deposited in this way, lower portion 62' of carbon nanotube layer 62 will become embedded within adhesive layer 68, thereby attaching carbon nanotube layer 62 to the surface of substrate 64. If desired, a layer of material may be interposed between adhesive layer 68 and substrate 64. The interposed layer may be a layer of metal foil, a polymer layer (e.g., a sheet of polyimide or other flexible polymer, a rigid polymer layer, etc.), a ceramic layer, a glass layer, a layer of polymer or other material to which carbon-fibers, glass fibers, or other fibers have been added, a rigid printed circuit board layer (e.g., a layer of fiberglass-filled epoxy), a layer of other materials, or a combination of two or more of these layers.

Figure 8:
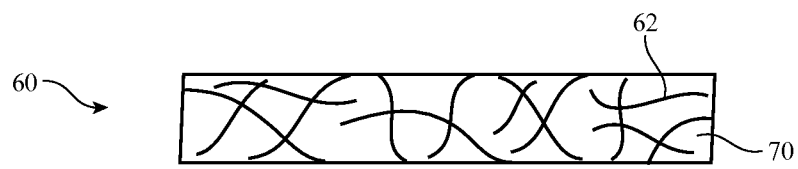
FIG. 8 is a cross-sectional side view of an illustrative carbon nanotube layer in which carbon nanotubes have been embedded in a matrix such as a polymer binder in accordance with an embodiment.

As shown in FIG. 8, carbon nanotube layer 60 may be formed by embedding carbon nanotubes 62 within polymer matrix 70. Some of nanotubes 62 may protrude from one or more of the surfaces of layer 60 or nanotubes 62 may be contained within polymer matrix 70. Polymer matrix 70 may be formed from a polymer that is initially liquid. While in a liquid state, carbon nanotubes 60 may be added to the liquid polymer. Solvent may then be evaporated from the liquid polymer or the liquid polymer may be cured (e.g., by application of ultraviolet light, heat, catalyst, etc.) to form a solid polymer matrix with embedded carbon nanotubes. Carbon nanotubes 62 may be sufficiently dense to form conductive paths within matrix 70 (i.e., carbon nanotube layer 60 may be conductive).

Carbon nanotubes 62 in FIGS. 5, 6, and 7 may be sufficiently dense to form conductive signal paths. If desired, other structures may be used to form carbon nanotube layer 60. The configurations of FIGS. 5, 6, 7, 8 are merely illustrative.

Figure 9:
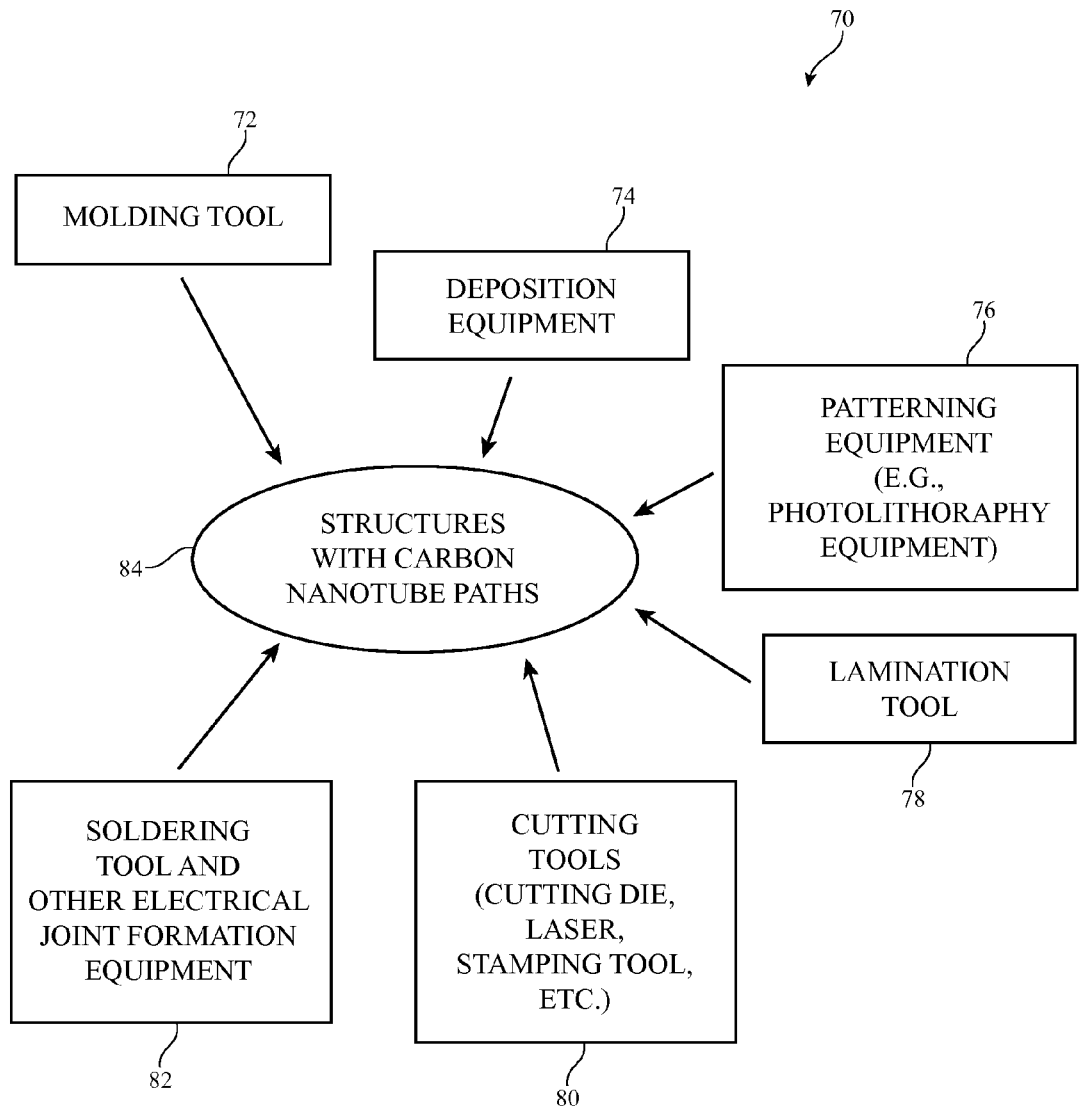
FIG. 9 is a diagram of illustrative equipment involved in forming carbon nanotube structures for an electronic device in accordance with an embodiment.

Illustrative equipment for forming electronic device structures such as structures with carbon nanotubes is shown in FIG. 9. As shown in FIG. 9, equipment 70 may be used in forming structures with carbon nanotube paths such as structures 84. The carbon nanotube paths may be used as signal lines in displays, touch sensors, flexible printed circuit cables, and other electronic device structures.

Molding tool 72 may be used to apply heat and pressure to plastic parts. The plastic parts may include polymer substrate layers, plastic carrier structures, injection-molded structures, and other molded polymer structures. Carbon nanotube paths may be incorporated into the molded polymer structures before molding, after molding, or both before and after molding operations.

Deposition equipment 74 may be used in depositing carbon nanotubes for forming carbon nanotube paths, metal layers for patterned metal traces that are separate from or combined with the carbon nanotube paths, layers of dielectric for isolating signal paths and other conductive structures, and other materials. Deposition equipment 74 may include physical vapor deposition equipment, chemical vapor deposition equipment, ink-jet printing tools, screen printing equipment, tools for pad printing, nozzles for spraying or dripping material, electrochemical deposition equipment (e.g., equipment for electroplating metals onto carbon nanotubes or other materials), and other equipment for depositing materials.

Patterning equipment 76 may include photolithographic tools for patterning blanket films (e.g., equipment that uses masks, etching, etc. to pattern blanket films such as films with carbon nanotubes, metal layers, dielectric layers, etc.).

Lamination tool 78 may be used to attach layers of material to each other (e.g., metal films, polymer layers, layers of adhesive, carbon nanotube layers, etc.). Lamination tool 78 may include presses or other equipment that press layers together (e.g., so that adhesive layers or other layers are bonded together).

Cutting tools 80 may include laser cutting equipment, knife blades (e.g., a blade that is controlled by a computer-controlled positioner), laser patterning equipment, die stamping tools (e.g., die stamping structures mounted on a press, a stamping die mounted on a rotating drum or other roller-based stamping and/or embossing equipment, etc.).

Soldering tools and other equipment 82 may be used in forming electrical connections. Equipment 82 may include equipment for activating conductive bonds formed from anisotropic conductive adhesive and other conductive adhesive, equipment for reflowing solder such as an oven, hot bar, or lamp, equipment for forming connections from metallic paint, conductive adhesive, or other conductive materials, or other electrical connection formation equipment.

Figure 10:
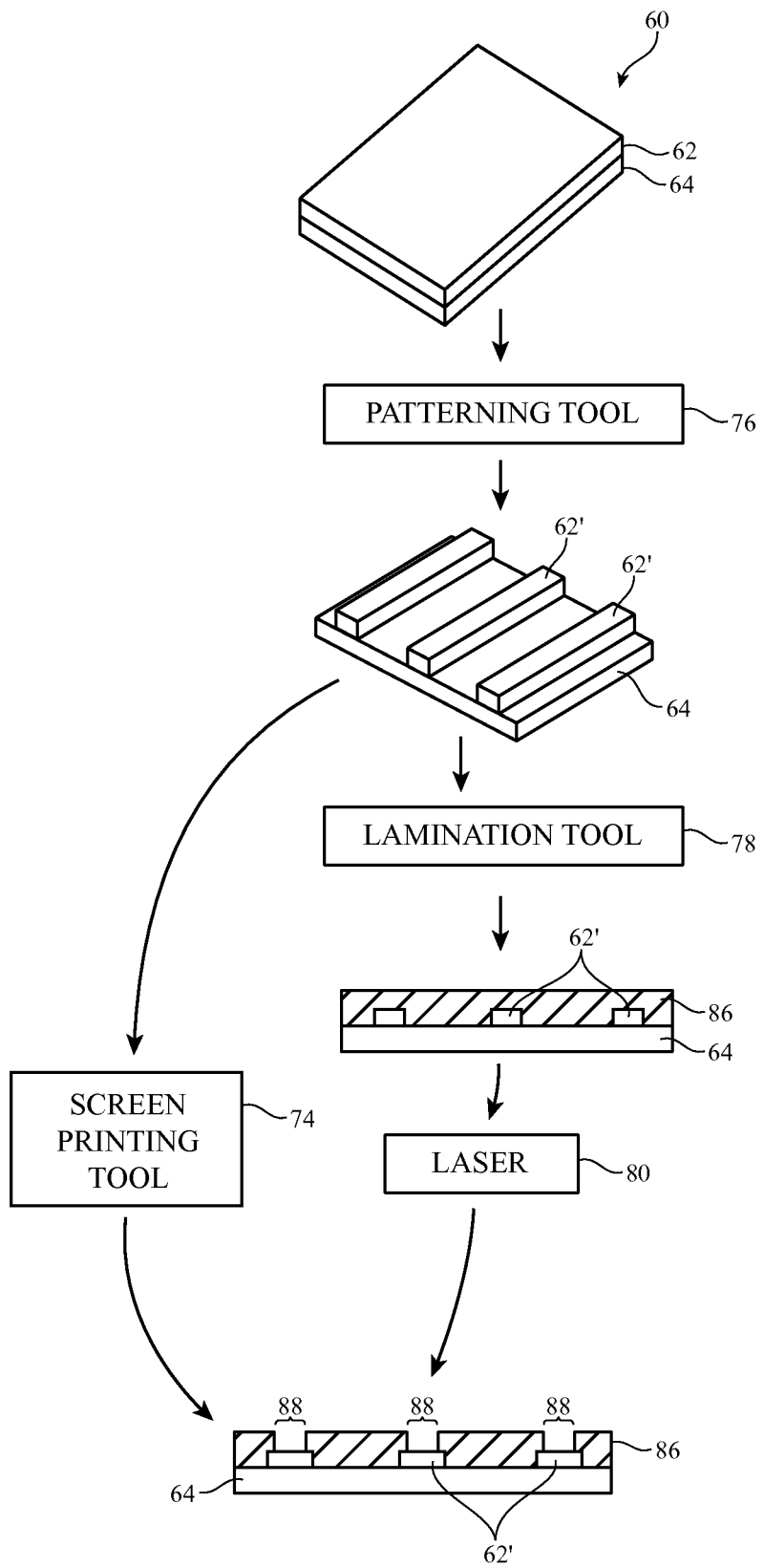
FIG. 10 is a diagram of illustrative operations and equipment involved in forming carbon nanotube structures for a flexible substrate such as a flexible printed circuit in accordance with an embodiment.

FIG. 10 is a diagram showing how carbon nanotubes may be used in forming signal paths on a substrate. In the example of FIG. 10, carbon nanotube layer 60 includes a layer of carbon nanotubes 62 on substrate layer 64 (e.g., a flexible printed circuit substrate layer such as a layer of flexible polyimide or a sheet of other flexible polymer). Patterning tool 76 may be used to pattern nanotubes 62 to form one or more carbon nanotube signal paths (paths 62'). Patterning tool 76 may, for example, include photolithography equipment and equipment for removing undesired portions of nanotubes 62 (e.g., etching equipment).

After patterning nanotube layer 60 to form individual carbon nanotube signal paths 62' on the upper surface of substrate 64, a dielectric cover layer (coverlay) such a layer 86 may be formed on top of carbon nanotube signal paths 62'. With one suitable arrangement, layer 86 is formed from a liquid polymer that is deposited using screen printing tool 74 or other suitable deposition tool. Using tool 74, layer 86 may be deposited in a pattern that forms one or more openings 88. Openings 88 may be aligned with signal paths 62' (e.g., openings 88 may expose regions for solder pads or other contacts formed from underlying portions of paths 62'). With another suitable arrangement, lamination tool 78 or equipment for depositing a blanket layer of dielectric may be used to form dielectric layer 86 on the upper surface of substrate 64 over carbon nanotube signal lines 62'. Laser 80 or other equipment may then be used to form openings 88. If desired, metal may be deposited in openings 88 before or after forming layer 86 (e.g., to help form contacts suitable for receiving solder joints). Substrate 64, carbon nanotube signal paths 62', and other layers such as dielectric cover layer 86 may form a flexible printed circuit, a rigid printed circuit, or other suitable structure.

FIGS. 11A, 11B, 11C, 11D, and 11E show another illustrative technique for forming carbon nanotube signal paths (e.g., signal paths on a printed circuit).

Figure 11A:
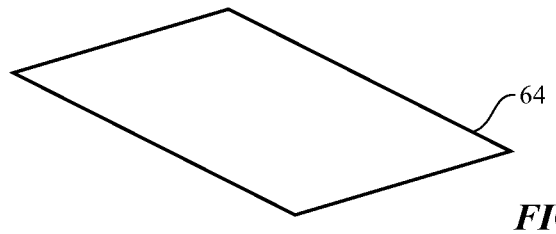
FIGS. 11A, 11B, 11C, 11D, and 11E are perspective views of an illustrative printed circuit with carbon nanotubes during various phases of fabrication in accordance with an embodiment.

FIG. 11A shows how substrate 64 may initially be devoid of carbon nanotube structures. Substrate 64 may be a layer of dielectric such as a sheet of flexible or rigid polymer.

Figure 11B:
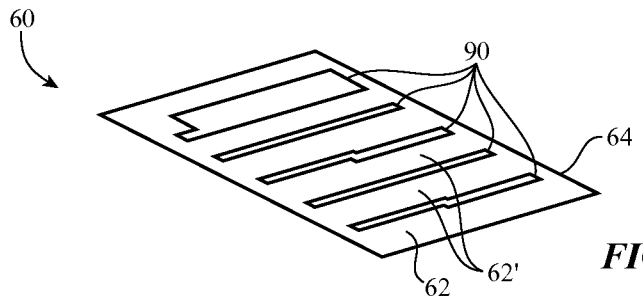

To form carbon nanotube paths, a blanket layer of carbon nanotubes (layer 62) is deposited on substrate 64 and openings 90 are formed (e.g., using cutting tools 80 such a cutting die, as shown in FIG. 11B. The portions of carbon nanotube layer 62 that are not removed when forming openings 90 are used to form signal path portions 62'. If desired, carbon nanotube layer 60 may be formed using other arrangements as described in connection with FIGS. 5, 6, 7, and 8.

Figure 11C:
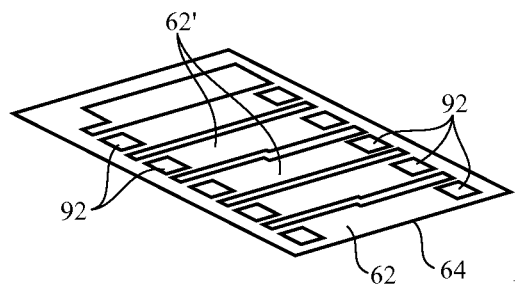

FIG. 11C shows how conductive regions such as metal pads 92 may be formed on selected portions of signal paths 62' such as the opposing ends of each path 62'. Metal pads 92 may be formed by evaporating metal through a shadow mask, by printing metallic paint onto portions of paths 62', by electroplating copper and gold layers or other metal layers onto portions of path 62', by etching or otherwise patterning blanket metal films, etc.

Figure 11D:
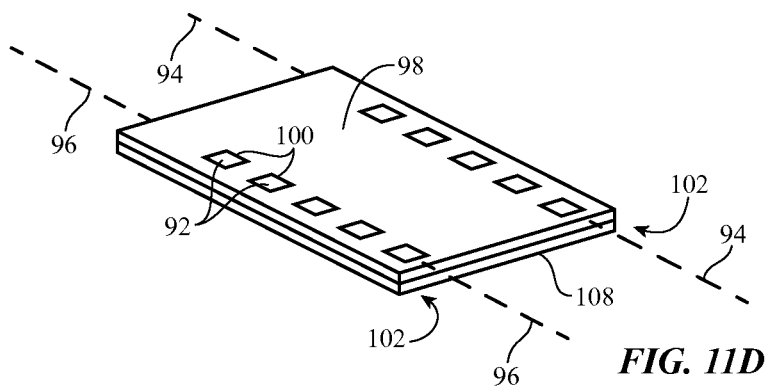

As shown in FIG. 11D, after metal pads 92 have been formed on paths 62', paths 62' may be sandwiched between upper and lower polymer layers or other dielectric layers (e.g., flexible polyimide sheets or other flexible substrate material, etc.) such as upper dielectric cover layer 98 and lower dielectric layer 108. Dielectric cover layer 98 may be formed on the upper surface of substrate 64 covering paths 62'. Layer 98 may include openings 100 that are aligned with respective pads 92, so that pads 92 are exposed through openings 100. Layer 98 may be formed from screen printed polymer, a photoimageable polymer that is patterned using photolithography, a laminated polymer sheet (e.g., a sheet of polymer attached to carbon nanotube layer 60 using adhesive), or other dielectric layer that has openings 100 over pads 92. Layer 108 may be a flexible polymer layer such as a flexible polyimide layer or other polymer (as an example). Layer 108 may be attached to carbon nanotube layer 60 (i.e., paths 62') using adhesive or other suitable bonding techniques.

As shown in FIG. 11B, openings 90 to not extend across the entire width of layer 64 to ensure that paths 62' are held together for subsequent processing steps. If each opening 90 extended across all of layer 64, layer 64 (and layer 62 on layer 64) would be divided into a number of individual small pieces, which would make handling difficult or impossible. The presence of the uncut portions of layers 64 and 62 (layer 60) at opposing ends of paths 62' allows these portions to serve as a temporary support structure that secures paths 62' with respect to each other.

After the pad formation process of FIG. 11C and polymer layer attachment and patterning process of FIG. 11D, the uncut edge portions of layer 60 may be removed. For example, a cutting die, knife, laser cutter, or other equipment may be used to cut away edge portions 102 of the structures of FIG. 11D by forming cuts along cut line 94 and along cut line 96.

Figure 11E:
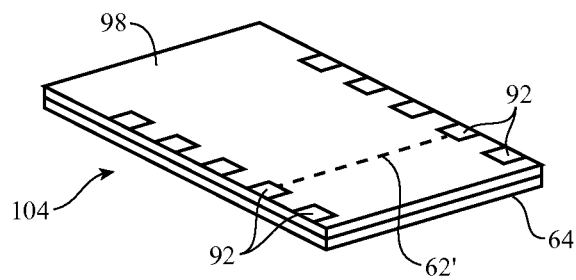

Flexible printed circuit 104 of FIG. 11E is formed by removing edge portions 102 of FIG. 11D. After edge portions 102 have been removed, pads 92 will be exposed along the edges of flexible printed circuit 104, leaving individual solder pads (contacts) 92 exposed. Each pair of pads (in the example of FIG. 11E) is coupled by a respective carbon nanotube signal path 62' embedded within the layers of flexible printed circuit 104. Because the edge portions have been removed, each signal path 62' in the flexible printed circuit may be isolated from the others. Pads 92 may be located at opposing ends of each signal path 62' and are available for bonding (e.g., soldering) to wires or other conductive paths in device 10.

Figure 12:
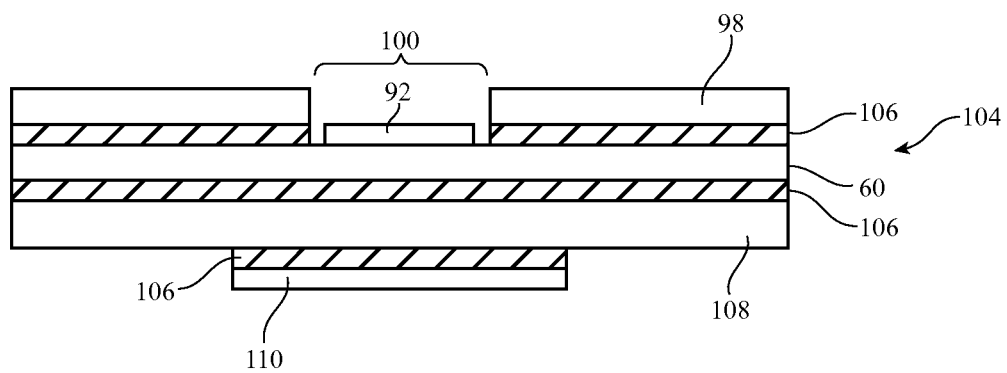
FIG. 12 is a cross-sectional side view of an illustrative carbon nanotube printed circuit with a stiffener in accordance with an embodiment.

FIG. 12 is a cross-sectional side view of an illustrative printed circuit with carbon nanotube paths formed from carbon nanotube layer 60. Printed circuit 104 may be flexible printed circuit, a rigid printed circuit, or a printed circuit with both rigid and flexible portions. In the example of FIG. 12, printed circuit 104 is flexible and has a stiffener such as stiffener 110 that locally stiffens flexible printed circuit 104. The region in which stiffener 110 is located may be, for example, a region that overlaps contacts (solder pads) such as solder pad 92. The presence of stiffener 110 under pads such as pad 92 may help prevent damage to solder joints formed on these pads that might otherwise arise from the flexing of flexible printed circuit 104. Stiffener 110 may be created from a metal sheet (e.g., a thin stainless steel layer), a plastic layer, or other rigid layers of plastic, metal, etc. Stiffener 110 may be attached to flexible printed circuit 104 using a layer of adhesive 106.

Layers of adhesive 106 may also be used in attaching together layers of material in printed circuit 104 such as dielectric layer 108, carbon nanotube layer 60, and dielectric layer 98, as shown in FIG. 12. Dielectric layers 108 and 98 may be formed from polyimide or other polymer layers. Openings may be formed in polymer layer 98 such as opening 100. Opening 100 may be aligned with metal solder pad 92 on carbon nanotube layer 60. Carbon nanotube layer 60 may be patterned to form individual signal paths 62' using an arrangement of the type shown in FIGS. 11A, 11B, 11C, 11D, and 11E or using other patterning techniques.

Figure 13:
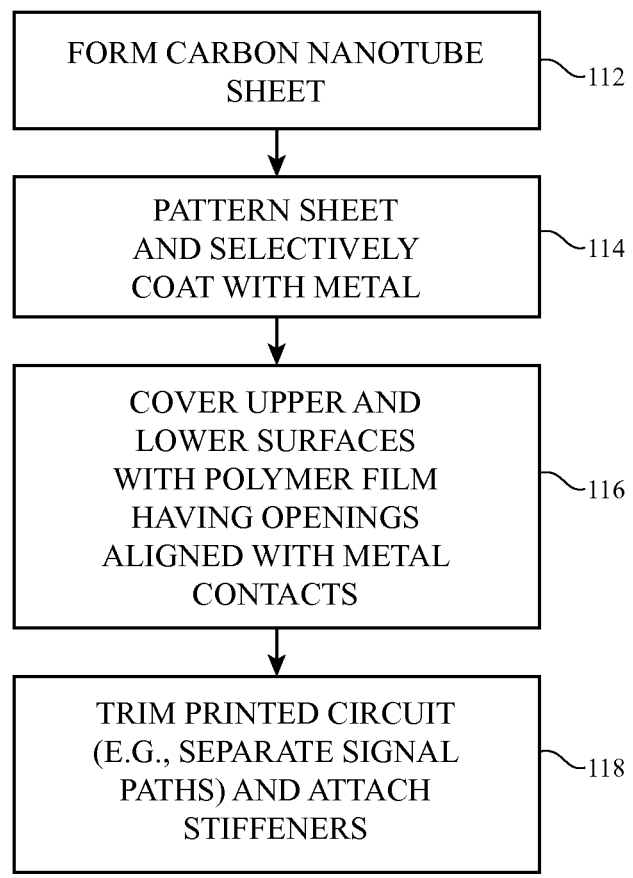
FIG. 13 is a flow chart of illustrative steps involved in forming carbon nanotube structures such as carbon nanotube printed circuits in accordance with an embodiment.

Illustrative steps involved in forming a flexible printed circuit of the type shown in FIG. 12 are shown in FIG. 13.

At step 112, carbon nanotube layer 60 may be fabricated. Carbon nanotube layer 60 may include carbon nanotubes and one or more supporting layers, as described in connection with FIGS. 5, 6, 7, and 8.

At step 114, carbon nanotube layer 60 may be patterned to form carbon nanotube signal paths using cutting techniques, photolithography, etc. Electroplating or other metal deposition techniques may be used to selectively coat portions of the carbon nanotube signal paths with metal (e.g., opposing end portions may be plated with copper and gold, etc.).

At step 116, dielectric layers (e.g., polyimide substrate layers or other flexible polymer sheets) may be attached to the upper and lower surfaces of the carbon nanotube layer. Adhesive layers such as adhesive layers 106 may be used, for example, to attach polymer layers 108 and 98 to the lower and upper surfaces of carbon nanotube layer 60. Layer 98 may be provided with openings 100 that overlap respective contacts (solder pads) 92, as shown in FIG. 12.

Following attachment of polymer layers 108 and 98, stiffener 110 may be attached to flexible printed circuit 104 using adhesive 106 in a portion of flexible printed circuit 104 that overlaps pads 92 or other suitable portion of flexible printed circuit 104 (step 118).

Figure 14:
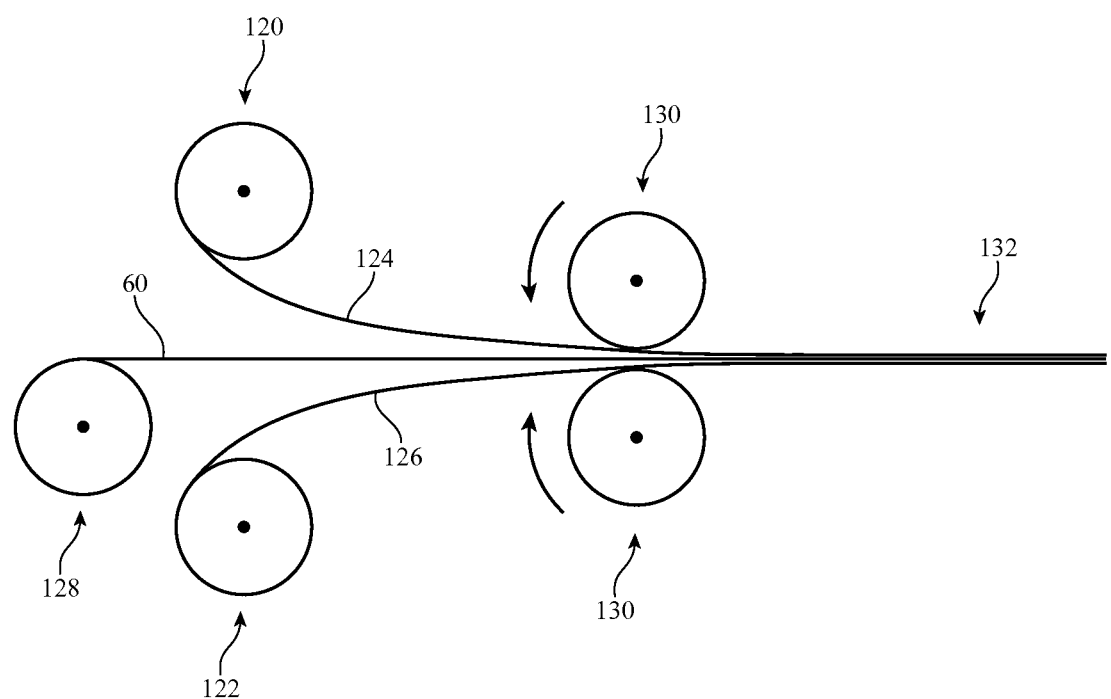
FIG. 14 is a side view of illustrative roller-based equipment for laminating layers together for a carbon nanotube printed circuit in accordance with an embodiment.

FIG. 14 is a diagram of illustrative roller-based equipment that may be used in forming flexible printed circuit material with carbon nanotubes. As shown in FIG. 14, carbon nanotube layer 60 may be dispensed from roller 128. Upper roller 120 may dispense upper flexible polymer layer 124 and lower roller 122 may dispense lower flexible polymer layer 126. Rollers 130 may compress carbon nanotube layer 60 between layers 124 and 126 to form laminated layers 132. Heat may be applied during lamination. In laminated layers 132 (e.g., flexible printed circuit material), carbon nanotube layer 60 may be sandwiched between respective polymer layers.

If desired, the polymer layers may be coated with adhesive to attach the polymer layers to the carbon nanotube layer. With one suitable arrangement, layers 124 and 126 may be layer such as layers 98 and 108 of FIG. 12 and may be attached to carbon nanotube layer 60 using adhesive 106. Carbon nanotube layer 60 may be patterned before lamination between layers 124 and 126 and/or after lamination between layers 124 and 126 (e.g., by die cutting, laser cutting, photolithography to pattern carbon nanotubes on a substrate layer, etc.). Carbon nanotube layer 60 may also be sandwiched between polymer layers for a flexible printed circuit using planar press structures (e.g., a heated metal press) in addition to or instead of using roller-based lamination systems. Dielectric coatings may also be formed by spraying, dipping, etc. The example of FIG. 14 is merely illustrative.

Figure 15:
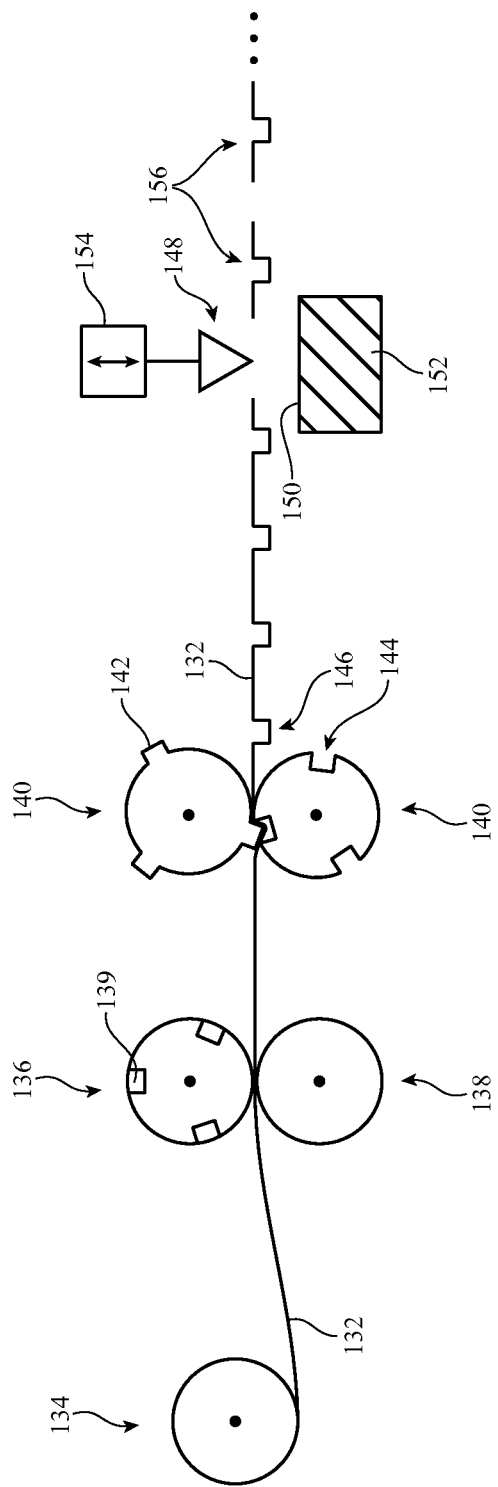
FIG. 15 is a side view of illustrative stamping equipment such as roller-based stamping equipment of the type that may be used to form carbon nanotube structures in accordance with an embodiment.

As shown in FIG. 15, roller-based stamping equipment may be used to form carbon nanotube printed circuit structures. Roller 134 may dispense layer 132. Layer 132 may be a layer of flexible substrate material (e.g., flexible printed circuit material) that includes a carbon nanotube layer such as layer 60 that has been laminated between respective polymer layers such as layers 124 and 126 (FIG. 14) or may contain only layer 60 (as examples). Rollers 136 and 138 may have stamping features 139 that cut openings in layer 132. Embossing rollers 140 may have protrusions such as protrusions 142, mating recesses such as recesses 144, or other embossing features. As layer 132 passes through rollers 140, the features on rollers 140 create bends such as bends 146 and other features in layer 132. Heat may be applied using rollers or other sources during embossing. The heat may help mold or otherwise shape the polymer of layer 132.

Embossed layer 132 may be cut into individual sections using a cutter. For example, computer-controlled positioner 154 may press cutting head 148 against surface 150 of cutting block 152 repeatedly to cut layer 132 into respective embossed flexible printed circuit portions 156. Portions 156 may contain one or more bends or other features. Flexible printed circuits 156 may then be installed within device 10. If desired, layer 132 may include semi-rigid layers and the rollers or other equipment of system 15 may be heated to cure the semi-rigid layers following embossing. Printed circuits 156 may therefore be rigid printed circuits with carbon nanotube signal paths, if desired.

Figure 16:
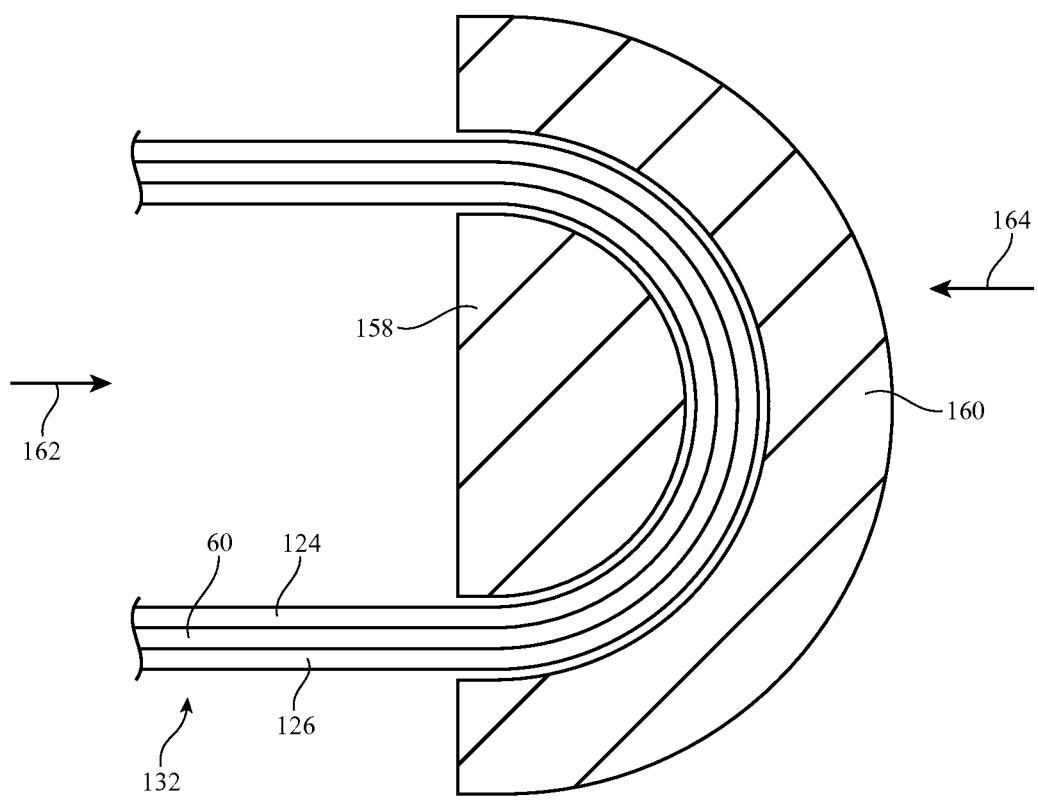
FIG. 16 is a cross-sectional side view of an illustrative carbon nanotube structure during molding and bending operations in accordance with an embodiment.

To ensure that a carbon nanotube flexible printed circuit can exhibit a tight bend radius, it may be desirable to mold carbon nanotube signal paths such as paths formed from carbon nanotube layer 60 within plastic. Roller-based equipment of the type shown in FIG. 15 may be used. Alternatively, heated mold die may be used. This type of arrangement is shown in FIG. 16. As shown in FIG. 16, mold structures such as mold structure 158 and mold structure 160 may be pushed in directions 162 and 164, respectively. This compresses flexible printed circuit 132 between the opposing inner surfaces of mold structures 158 and 160. Polymer layers 124 and 126 may be formed from polymer material that is set into a desired shape under application of heat and pressure from mold structures 158 and 160. When mold structures 158 and 160 are removed, the molded polymer portions will maintain their bent shape and will maintain the bent carbon nanotube signal paths in their bent shape. Flexible printed circuit 132 will therefore retain a desired shape (e.g. a semicircular bend shape in the example of FIG. 16). The shape into which carbon nanotube flexible printed circuit material 132 is molded may have one bend, two bends, or more than two bends. The bends may be right angle bends such as the right-angle edge bends of portions 42E in FIG. 4, may be 180° bends (as shown in FIG. 16), or may have other suitable shapes.

Figure 17:
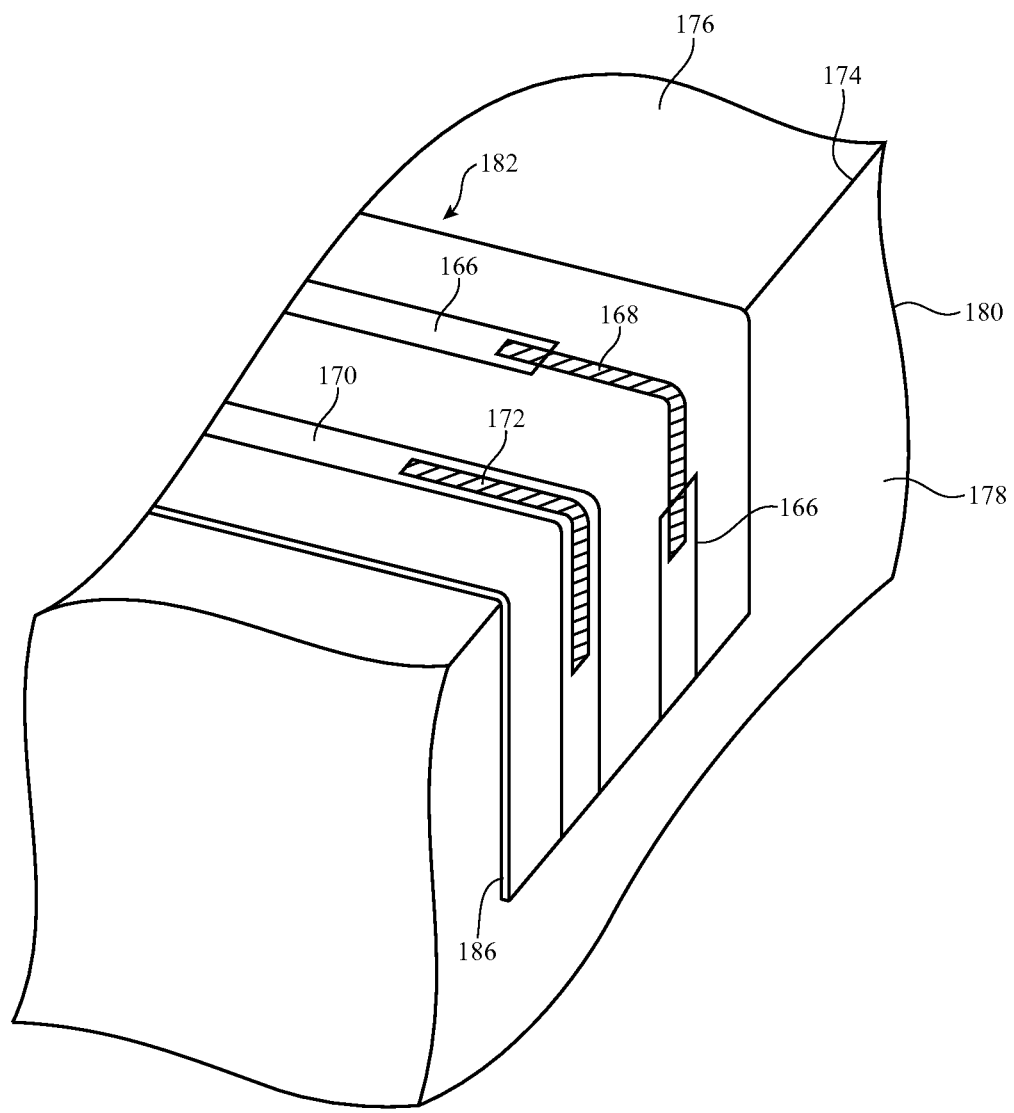
FIG. 17 is a perspective view of an illustrative carbon nanotube structure with a right-angle bend in accordance with an embodiment.

To help prevent cracks in the signal lines traversing bent portions of a flexible substrate from disrupting signal flow, some or all of these signal lines may include carbon nanotubes. The carbon nanotubes may be patterned to form carbon nanotube traces 62' as described in connection with FIGS. 11 and 12. Carbon nanotubes may also be combined with metal lines. Consider, as an example, the configuration of FIG. 17. As shown in FIG. 17, flexible substrate 182 may have a bend where flexible substrate 182 traverses angled edge 174 of support structure 180 between planar upper surface 176 of support structure 180 and planar side surface 178 of support structure 180. Flexible substrate 182 may be a carbon nanotube flexible printed circuit, a flexible substrate in a display, a flexible touch sensor substrate, or other suitable flexible structure. Flexible substrate 182 may have signal paths formed on a flexible polymer layer such as polymer layer 186 (e.g., a polyimide layer, etc.). A dielectric cover layer may cover the surface of substrate 182.

The signal paths on substrate 182 may be formed from metal and carbon nanotubes. In some situations, the signals paths on polymer layer 186 may be formed entirely from carbon nanotubes. In other situations, at least some of the signal paths may include metal. For example, a signal path may have metal portions 166 and carbon nanotube segment 168. Metal signal lines 166 may have a gap in the portion of layer 186 that traverses the bend at edge 174. This avoids metal signal line cracking To electrically connect metal signal lines 166 on either side of the bend with each other, carbon nanotube segment 168 may bridge the gap in metal signal lines 166. With another suitable arrangement, a metal signal trace may be provided with a carbon nanotube coating and no metal signal trace gaps. For example, metal line 170 may have a carbon nanotube trace such as trace 172. Carbon nanotube trace 172 may be formed from a carbon nanotube layer that has a linewidth comparable to the linewidth of metal line 170 and that covers some or all of line 170. In the example of FIG. 17, carbon nanotubes 172 form a line segment that covers metal signal line 170 in a portion of line 170 that crosses over bent edge 174 of support structure 180 and the corresponding bend in flexible polymer layer 186. Configurations of the type shown in FIG. 17 may be used to allow signal lines to traverse a hinge or other flexible joint in device 12 (see, e.g., hinge axis 22 of FIG. 2).

Carbon nanotubes are flexible and are therefore resistant to cracking and undesired open circuit conditions due to bends. By providing flexible substrate 182 with carbon nanotube paths that cover metal paths in at least the portion of the metal paths that bend, the likelihood of undesired open circuit conditions in the signal paths is reduced.

Figure 18:
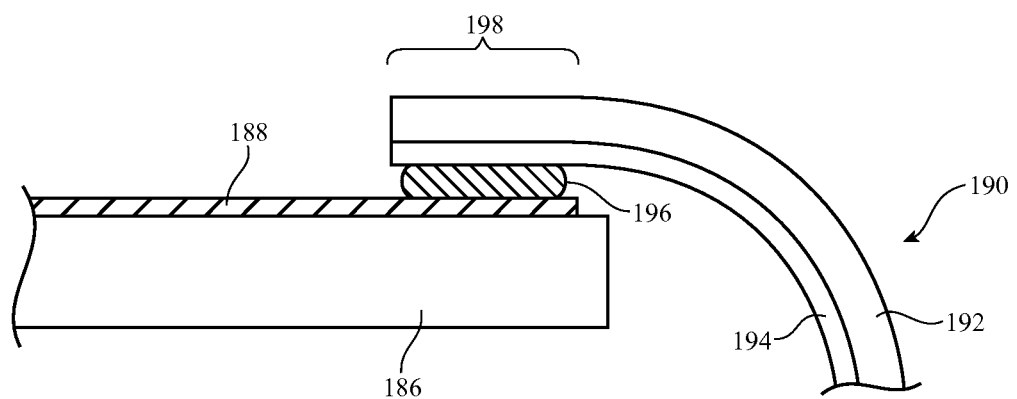
FIG. 18 is a cross-sectional side view of an illustrative carbon nanotube structure coupled to another structure using conductive material in accordance with an embodiment.

FIG. 18 shows how a flexible printed circuit or other flexible substrate may have carbon nanotubes that are coupled to a metal signal trace or other signal path on another substrate. As shown in FIG. 18, signal trace 188 may be formed on substrate 186. Signal trace 188 may be formed from metal, carbon nanotubes, or both metal and carbon nanotubes. Substrate 186 may be a dielectric such as a polymer (e.g., a flexible printed circuit substrate material). Flexible printed circuit 190 may contain signal paths such as signal path 194. Signal path 194 may be formed from carbon nanotubes and my, if desired, include metal (e.g., a plated metal solder pad). A dielectric cover layer may cover traces such as path 194. At connection 198, conductive material 196 may be used to couple signal path 194 to signal path 188. Conductive material 196 may be solder, conductive adhesive, or other conductive material.

Figure 19:
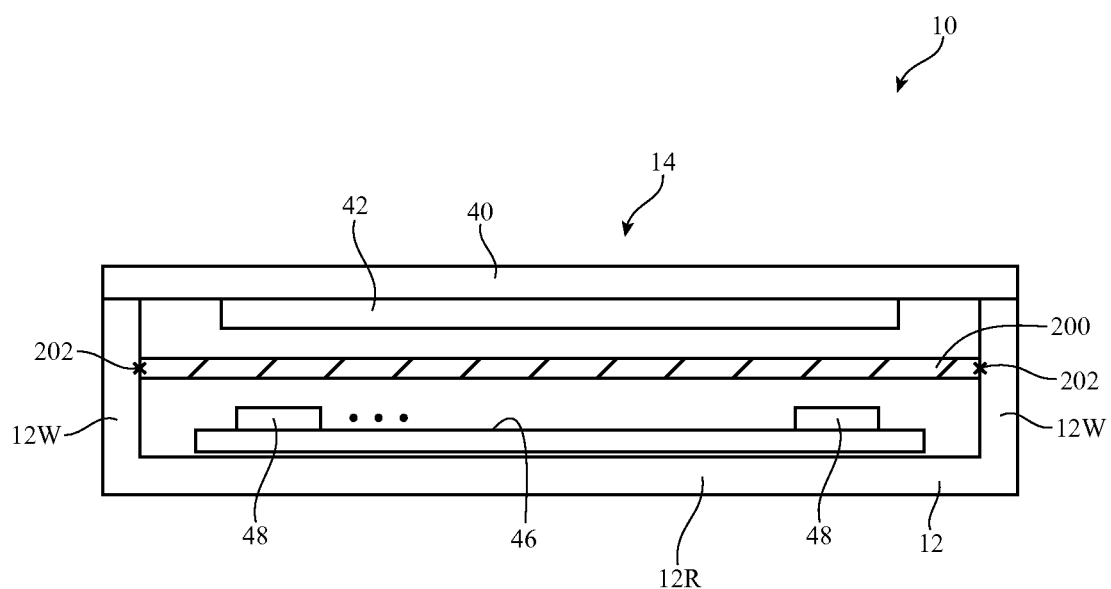
FIG. 19 is a cross-sectional side view of an illustrative electronic device that has a structural housing member such as a midplate member formed from carbon fiber material in accordance with an embodiment.

FIG. 19 is a cross-sectional side view of an illustrative electronic device showing how carbon nanotube material may be used in forming a structural component in device 10 such as an internal housing member. In the example of FIG. 19, device 10 has a display such as display 14 that is mounted in housing 12. Display 14 includes display cover layer 40 and display module 42. Electrical components 48 may be mounted on printed circuit 46 within housing 12. Housing 12 may have rear housing wall 12R and sidewalls 12W. Sidewalls 12W may be vertical sidewalls and/or may be curved sidewalls. Carbon nanotube structure 200 (e.g., a layer of carbon nanotubes such as carbon nanotube layer 60, etc.) may extend between respective sidewalls 12W and may span the interior of housing 12.

Carbon nanotube structures 200 may, for example, form a carbon nanotube housing midplate. The carbon nanotube midplate may be formed from carbon nanotubes, a substrate (e.g., metal, plastic, etc.), metal layer(s), polymer layer(s), or other suitable materials (see, e.g., FIGS. 5, 6, 7, and 8). With one suitable arrangement, carbon nanotube structures 200 may form a planar sheet that is connected to housing sidewalls 12W with connections 202. Connections 202 may include mounting brackets, fasteners such as screws, welds, solder, adhesive, or other attachment mechanisms. The presence of carbon nanotube midplate in housing 12 may help provide housing 12 and device 10 with structural rigidity (e.g., torsional rigidity. Components may be packed into the interior spaces of device 10 above and below the carbon nanotube midplate and may help further enhance rigidity.

Carbon nanotubes can be strong and light, so the use of a carbon nanotube midplate may allow the size of device 10 to be minimized. If desired, carbon nanotubes may be provided in other electronic device structures to provide enhanced strength. Carbon nanotube layers may be patterned to form sheets and other thin layers, structures with curves (e.g., brackets), traces on dielectric support structures, and portions of other structural members in device 10. The use of a carbon nanotube layer (e.g., layer 60) to form a structural midplate member in the housing of device 10 (e.g., a portable device such as a cellular telephone, etc.) is merely illustrative.

The foregoing is merely illustrative and various modifications can be made by those skilled in the art without departing from the scope and spirit of the described embodiments. The foregoing embodiments may be implemented individually or in any combination.

What is claimed is:

1. A carbon nanotube flexible printed circuit, comprising:
a first polymer layer;
carbon nanotube signal paths on the first polymer layer;
metal solder pads on portions of the carbon nanotube signal paths, wherein the metal solder pads are in direct contact with the carbon nanotube signal paths; and
a second polymer layer on the first polymer layer, wherein the metal solder pads comprise first and second metal solder pads on respective first and second opposing ends of one of the carbon nanotube signal paths, wherein the second polymer layer has first and second openings that are respectively aligned with the first and second metal solder pads, and wherein the first and second polymer layers comprise molded portions that maintain a bend in the carbon nanotube signal paths.

2. The carbon nanotube flexible printed circuit defined in claim 1 wherein the carbon nanotube signal paths are interposed between the first polymer layer and the second polymer layer.

3. The carbon nanotube flexible printed circuit defined in claim 2 wherein the metal solder pads comprise electroplated metal.

4. The carbon nanotube flexible printed circuit defined in claim 3 further comprising a stiffener under at least some of the metal solder pads.

5. The carbon nanotube flexible printed circuit defined in claim 4 wherein the stiffener comprises a layer of metal attached to the first polymer layer with a layer of adhesive.

6. The carbon nanotube flexible printed circuit defined in claim 1 further comprising a first layer of adhesive between the first polymer layer and the carbon nanotube signal paths and a second layer of adhesive between the second polymer layer and the carbon nanotube signal paths.

7. A carbon nanotube flexible printed circuit, comprising:
a first polymer layer with first and second opposing sides;
a carbon nanotube signal path on the first side of the first polymer layer, wherein the carbon nanotube signal path has first and second ends;
a first metal solder pad on the first end of the carbon nanotube signal path;
a second metal solder pad on the second end of the carbon nanotube signal path, wherein the carbon nanotube signal path electrically connects the first metal solder pad to the second metal solder pad; and
a stiffener formed under at least the first metal solder pad, wherein the stiffener is formed on the second side of the first polymer layer.

8. The carbon nanotube flexible printed circuit defined in claim 7, further comprising:
a second polymer layer on the first polymer layer, wherein the carbon nanotube signal path is interposed between the first and second polymer layers.

9. The carbon nanotube flexible printed circuit defined in claim 8, wherein the second polymer layer has a first opening that is aligned with the first metal solder pad and a second opening that is aligned with the second metal solder pad.

10. The carbon nanotube flexible printed circuit defined in claim 7, wherein the first and second metal solder pads are in direct contact with the carbon nanotube signal path.

11. The carbon nanotube flexible printed circuit defined in claim 8, wherein the first and second polymer layers comprise molded portions that maintain a bend in the carbon nanotube signal path.

12. The carbon nanotube flexible printed circuit defined in claim 8, wherein the first and second polymer layers have a bend and wherein the carbon nanotube signal path is bent along the bend.

* * * * *